United States Patent [19]

Pandya et al.

[11] Patent Number: 4,743,567
[45] Date of Patent: May 10, 1988

[54] METHOD OF FORMING THIN, DEFECT-FREE, MONOCRYSTALLINE LAYERS OF SEMICONDUCTOR MATERIALS ON INSULATORS

[75] Inventors: Ranjana Pandya, Cold Spring; Andre M. Martinez, Wappingers Falls, both of N.Y.

[73] Assignee: North American Philips Corp., New York, N.Y.

[21] Appl. No.: 84,657

[22] Filed: Aug. 11, 1987

[51] Int. Cl.⁴ ............... H01L 21/265; H01L 21/225
[52] U.S. Cl. ............... 437/84; 148/DIG. 93; 156/DIG. 88; 437/17; 437/19
[58] Field of Search ............... 437/17, 19, 84; 156/DIG. 88

[56] References Cited

U.S. PATENT DOCUMENTS

| | | | |
|---|---|---|---|
| 4,309,225 | 1/1982 | Fan et al. | 437/19 |
| 4,330,363 | 5/1982 | Biegesen et al. | 156/620 |
| 4,473,433 | 9/1984 | Bosch et al. | 156/DIG. 88 |
| 4,479,846 | 10/1984 | Smith et al. | 148/DIG. 93 |
| 4,559,086 | 12/1985 | Hawkins | 437/19 |
| 4,564,403 | 1/1986 | Hayafuji et al. | 437/19 |
| 4,581,620 | 4/1986 | Yamazaki et al. | 148/DIG. 77 |
| 4,650,524 | 3/1987 | Kiyama et al. | 437/19 |
| 4,659,422 | 4/1987 | Sakurai | 156/DIG. 88 |

Primary Examiner—Upendra Roy
Attorney, Agent, or Firm—Norman N. Spain

[57] ABSTRACT

A structure comprising thin defect-free monocrystalline layer of a silicon of an insulating layer is produced from a structure comprising a thin recrystallizable layer of silicon on an insulating layer by use of a low softening point insulating layer, scanning the structure relative to a zone heater the beams of which are focused on the recrystallizable silicon layer so as to form a melt zone having a convex solid-liquid interface in the silicon layer while forming a liquid area under the melt zone in the insulating layer.

15 Claims, 1 Drawing Sheet

METHOD OF FORMING THIN, DEFECT-FREE, MONOCRYSTALLINE LAYERS OF SEMICONDUCTOR MATERIALS ON INSULATORS

BACKGROUND OF THE INVENTION

The invention in this application is concerned with a method of forming thin, defect-free monocrystalline layers of semiconductor materials on insulators. The invention is particularly concerned with the formation of thin monocrystalline layers of silicon on insulators, the so-called SOI structure.

In the production of silicon on insulated structures a thin layer of polycrystalline or amorphous silicon is deposited on an insulating substrate particularly oxidized silicon or quartz. A small molten zone in the amorphous or polycrystalline silicon layer is produced by localized heating of the silicon layer which molten zone is scanned across the silicon layer while the underlying substrate is heated. As the molten layer of silicon crystallizes, the silicon layer is converted to a monocrystalline layer.

Such a procedure is well known in the art are shown for example in European Patent Application No. 0129261, Anthony, U.S. Pat. No. 4,585,493, Kline, U.S. Pat. No. 4,590,130, J. Sakurai, J. Electrochem Soc. Solid-State Science and Technology, pp. 1485–1488 (July 1986), C. L. Bleil et al, Mat. Res. Soc. Symp. Proc. Vol. 35, pp. 689–692 and Japanese Kokai 61-19116.

A problem with these prior art methods is that the recrystallization by these zone melting methods causes defects to be formed in the resultant crystalline layer. These defects are found primarily to be the presence of subgrain or low angle grain boundaries. These subgrain boundaries are believed to arise due to stress on the growing crystal. These stresses are believed to originate from such sources as chemical impurities, surface roughness, volume expansion on freezing and thermal gradients.

The Japanese Kokai, L. L. Bleil et al and J. Sakurai show examples of the use of low melting glasses such as phosphosilicate glass, borophosphosilicate glass or Corning 7059 as substrates underlying the recrystallizable silicon layer.

Prior to the instant invention applicants thought that by use of these substrates an alternate mechanism for stress relief would be provided during crystal growth so that the formation of low-angle grain boundaries would be eliminated or significantly reduced. However, the use of these substrates has not resulted in fully eliminating the formation of these boundaries.

SUMMARY OF THE INVENTION

An object of the instant invention is to provide a method for forming thin, defect-free monocrystalline layers of semiconductor materials of significantly larger areas on insulators. Other objects of the invention will be apparent from the description that follows.

According to the invention, the applicants have developed a novel method of forming a thin defect free monocrystalline layer of a semiconductor layer on an insulator.

According to the invention, this novel method involves the combination of (a) depositing a thin polycrystalline or amorphous layer of a semiconductor material on a low softening point temperature insulating substrate which insulating substrate has a softening point of at least abou 10° C. below the melting point of the semiconductor material with a slope of its viscosity versus temperature curve of less than 0 and greater than negative infinity; (b) heating the layer of semiconductor material by means of a zone heating source in such a manner as to provide a convex solid-liquid interface on the layer of the semiconductor material while the resultant layered structure is scanned (moved) relative to the zone heating source while the substrate is heated at its annealing point and (c) controlling the scanning speed of the structure relative to the zone heating source in order to cause the convex solid liquid interface to move along the layer of semiconductor material while the surface of the substrate opposing the layer of the semiconductor material is liquified under that solid-liquid interface.

By the use of the method of the invention the distance between the low angle grain boundaries in the resulting recrystallized layer is significantly increased.

The distance between low angle grain boundaries in the recrystallized silicon layers produced on high softening point substrates such as quartz normally averages about 5 microns. However, by use of the method of the invention distances between the low angle grain boundaries of around 300 microns have frequently been produced while distances between low angle grain boundaries of as much as one-half millimeter have been produced.

It should be noted that the term "softening point" of a material having a softening range is by convention that defined as the temperature at which its viscosity is $1 \times 10^7$ poises.

DETAILED DESCRIPTION OF THE INVENTION

Figure 1:
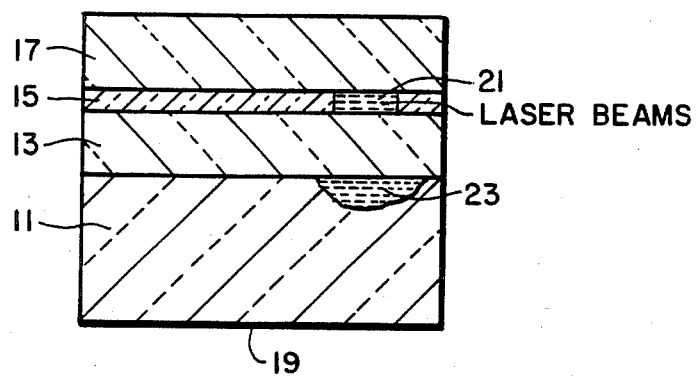
FIG. 1 is a cross-sectional view of a semiconductor structure formed while carrying out the method of the invention.

While the instant invention is particularly useful for forming thin defect-free monocrystalline layers of silicon on an insulator base it is also useful for forming thin defect-free monocrystalline layers of other semiconductor materials such as Ge, ZnSe, and InSb.

While various materials meeting the requirements of the invention may be used as insulators preferably those materials are employed which in addition have linear expansion coefficients compatible with that of the semiconductor material.

Thus for silicon, soft glasses such as phosphosilicate glass and borophosphosilicate glass, NA-40 (an alumino-silicate glass produced by the Hoya Company) and 7059 glass produced by the Corning Company and spin-on glass are particularly useful. While any of these glasses may be employed as essentially the sole supporting member for the silicon layer it may also be employed as a thin layer applied to a quartz, silicon, or aluminum oxide or other suitable substrates.

A useful method of depositing the layer of semiconductor material to be recrystallized is by chemical vapor deposition. However other suitable methods known in the art such as sputtering may also be employed.

When silicon is employed as the semiconductor, it is generally applied at thicknesses of less than 10 μ. However a thickness of 2000 Å-10μ is preferred.

Other semiconductor materials may be applied in similar thicknesses.

The generation of the convex solid-liquid interface at the crystal growth front in the semiconductor material is important in producing layers with the defect-free crystal layers as the generation of such an interface pushes defects away from the center of the crystal towards the edges of the crystal causing wide areas of the crystal to be defect free.

Methods of producing convex liquid-solid interfaces during crystal growth of semiconductor layers deposited on insulating substrates are well known in the art. Suitable methods are shown for example in Biegelsen N. K. et al "Laser Induced Crystal Growth of Silicon Islands On Amorphous Substrates" in Gibbons et al Laser and Electron-Beam Solid Interactions and Materials Processing (Elsevier North Holland, 1981, pp. 487-494), Aizaki, N. "Recrystallization of SOI Structures By Split Laser Beam" In Furukawa, S. Silicon -on Insulator : Its Technology and Applications KIK Scientific, Tokyo, 1985, pp. 41-46, and Kawamura, S. et al "Recrystallization of Silicon On Insulator With a Heat-Sink Structure, Ibid, pp. 57-74, the entire contents of which last article are hereby incorporated by reference.

As shown in this latter article by S. Kawamura et al a convex shaped solid-liquid interface is formed by use of a doughnut-shaped laser beam in place of the usual Gaussian beam.

When the layer of semiconductor material to be recrystallized is silicon, scanning speeds of the silicon layer relative to the zone heating source of up to about 200 microns/sec. have been found to yield goods results when the substrate is the low-softening point insulating glass. However, when the low-softening insulating glass is deposited as a thin layer between the silicon layer and an insulating substrate of another material, scanning speeds of up to 1 mm/sec. have been found to yield good results.

Heating of the insulating substrate may be achieved by use of any desirable heat source, for example halogen lamps, mercury vapor lamps and carbon plate heaters.

For improvement of electrical properties and as a diffusion barrier to stop impurities from the substrate migrating to the silicon layer, a thin layer of about 200 Å- 2μ of a low temperature chemically vapor deposited silicon dioxide may be deposited between the polycrystalline or amorphous silicon layer and the insulating substrate particularly when the substrate is an aluminosilicate glass. Such a thin silicon dioxide layer may also be applied to the thin layer of silicon as a capping layer before recrystallization.

Preferred embodiments of the invention will now be described with reference to the figures of the drawing and the following examples.

EXAMPLE 1

As shown in FIG. 1 of the drawing, on a substrate of NA-40 glass 11 the following layers were deposited in sequence by low temperature chemical vapor deposition (LPCVD):1.0 micron of low temperature silicon oxide (LTO) 13, 0.5 micron of polycrystalline silicon 15 and a capping layer 17 of 2.0 microns of LTO on top of the polycrystalline silicon layer 15.

The resultant layered structure 19 was then heated to about 700°-720° C. by a graphite heater (not shown) to the annealing point of the glass substrate 11.

Figure 2:
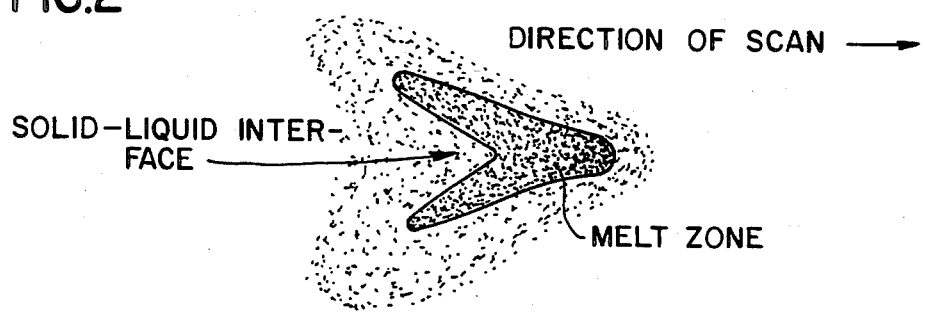
FIG. 2 is a photograph of a TV monitor image, enlarged about 23 times, of the melt zone showing a convex solid-liquid interface produced during the recrystallization of the silicon layer.

While being thus heated, the resultant layered structure 19 was mved (scanned) in a linear direction at a speed of about 140 microns per second past a zone heating system having overlapping laser beams focused to produce a melt zone 21 having a convex solid-liquid interface in the polycrystalline silicon layer 15 as shown in FIG. 2 while producing a molten zone 23 in the portion of the glass substrate 11 below the melt zone 21.

Figure 3:
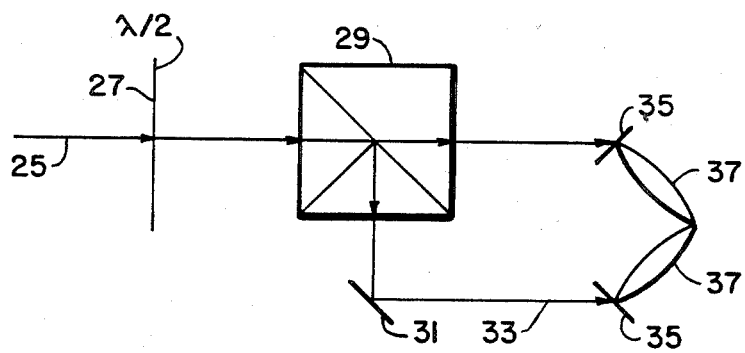
FIG. 3 is a schematic of an arrangement of a zone heating system for producing the convex solid-liquid interface of FIG. 2.

A suitable zone heating system for producing the convex solid-liquid interface is shown in FIG. 3.

As shown schematically in FIG. 3, an argon ion laser beam 25 of about 7 watts is passed through a half wave plate 27 and then through a polarizing cube beam splitter 29 of plane mirror 31 to form beams 33 which beams 33 are then focused by two cylindrical lenses 35 each having a focal length of 250 mm to form two elliptic shaped beams 37 which overlap on the sample to form a melt zone 21 convex solid-liquid interface in the polycrystalline silicon layer 15 as shown in FIG. 2.

By use of this method a 500 micron wide layer of defect-free monocrystalline silicon was produced with a length of 2 mm.

EXAMPLE 2

By a method similar to that employed in Example 1, the following layers were deposited in sequence starting with a quartz substrate: 5.0 microns phosphosilicate glass (PSG) containing 8% by weight of phosphorus, 1.0 microns LTO, 1.0 micron polycrystalline silicon and 1.5 microns LTO.

The phosphosilicate glass was annealed by heating at a temperature of about 1000°-1020° C. while zone heating of the polycrystalline silicon layer and scanning was carried out in a manner similar to that employed in Example 1.

A defect-free monocrystalline silicon layer with a width of 200 microns and a length of 2 mm was produced.

Similar results have been achieved with the use of oxidized silicon substrates and a carbon dioxide laser.

While the present invention has been described with reference to particular embodiments thereof, it will be understood that numerous modifications may be made by those skilled in the art without actually departing from the scope of the invention.

What we claim is:

1. A method of forming a thin, defect free, monocrystalline layer of a semiconductor material on an insulator, said method comprising,
   (a) depositing a thin polycrystalline or amorphous layer of a semiconductor material on an insulating substrate having a softening point at least about 10° C. below the melting point of said semiconductor material and a slope of its viscosity versus temperature curve of less than zero and greater than negative infinity to form a layered structure;
   (b) heating said layered structure from a zone heating source in such a manner so as to provide a convex solid-liquid interface in said layer of said semiconductor material while scanning said layered structure relative to said zone heating source and heating said substrate at its annealing point; and (c) controlling the scanning speed of said layered structure relative to said zone heating source so as to cause said convex solid-liquid interface to move along said layer of semiconductor material while the surface of the substrate opposing the semiconductor material is liquified under said convex solid-liquid interface.

2. A method of forming a thin, defect free, monocrystalline layer of a silicon on an insulator, said method comprising,
(a) depositing a thin polycrystalline or amorphous layer of a silicon on an insulating glass substrate having a softening point at least about 10° C. below the melting point of said silicon layer and a slope of its viscosity versus temperature curve of less than zero but greater than negative infinity to form a layered structure;
(b) heating said layered structure from a zone heating source in such a manner so as to provide a convex solid-liquid interface in said layer of said silicon while scanning said layer of silicon relative to said zone heating source and heating said insulating glass substrate at its annealing point; and
(c) controlling the scanning speed of layered structure relative to said zone heating source so as to cause said convex solid-liquid interface to move along said layer of silicon while the surface of the insulating glass layer opposing said silicon layer is liquified under said convex solid-liquid interface.

3. A method of forming a thin, defect-free monocrystalline layer of silicon on an insulator, said method comprising,
(a) depositing a thin polycrystalline or amorphous layer of silicon on a glass substrate selected from the group consisting of phosphosilicate glass, borophosphosilicate glass and aluminosilicate and spin-on glass.
(b) heating said layered structure from a zone heating source in such a manner so as to provide a convex solid-liquid interface in said silicon layer while scanning said layered structure relative to said zone heating source and heating said glass substrate at its annealing point; and
(c) controlling the scanning speed of said layered structure relative to said zone heating source so as to cause movement of said solid-liquid interface along said silicon layer while the surface of said glass substrate opposing said silicon layer is liquified under said convex solid-liquid interface.

4. The method of claim 2 wherein the insulating glass substrate is a thin layer supported at its surface opposite to that of the silicon layer by a oxidized silicon or quartz substrate.

5. The method of claim 2 wherein both surfaces of the thin polycrystalline or amorphous silicon layer are provided with a low temperature chemical vapor deposited coating of silicon dioxide.

6. The method of claim 2 wherein the thin silicon layer is less than 10 microns thick.

7. The method of claim 3 wherein both surfaces of the thin polycrystalline or amorphous silicon layer are provided with a low temperature chemical vapor deposited coating f silicon dioxide.

8. The method of claim 3 wherein the scanning speed is less than about 200 microns per second.

9. The method of claim 4 wherein the insulating glass layer is a layer of phosphosilicate glass, borophosphosilicate glass, aluminosilicate glass or spin-on glass.

10. The method of claim 4 wherein the thin silicon layer is less than 10 microns thick.

11. The method of claim 6 wherein the thin silicon layer is 2000 Å- 10$\mu$ thick.

12. The method of claim 9 wherein the scanning speed is less than 1 mm per second.

13. The method of claim 10 wherein the thin silicon layer is 2000 Å- 10$\mu$ thick.

14. The method of claim 11 wherein the thin silicon layer is chemically vapor deposited.

15. The method of claim 13, wherein the thin silicon layer is chemically vapor deposited.

* * * * *